United States Patent
Schroeder et al.

(10) Patent No.: US 10,937,717 B2
(45) Date of Patent: Mar. 2, 2021

(54) HEATSINK SECURED TO A HEAT SOURCE

(71) Applicant: Intel Corporation, Santa Clara, CA (US)

(72) Inventors: Michael Aaron Schroeder, Chandler, AZ (US); Stephen Andrew Langanke, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/370,139

(22) Filed: Mar. 29, 2019

(65) Prior Publication Data
US 2019/0230820 A1    Jul. 25, 2019

(51) Int. Cl.
*H05K 7/20* (2006.01)
*H01L 23/40* (2006.01)

(52) U.S. Cl.
CPC ....... *H01L 23/4006* (2013.01); *H05K 7/2049* (2013.01); *H05K 7/20218* (2013.01); *H01L 2023/405* (2013.01); *H01L 2023/4087* (2013.01)

(58) Field of Classification Search
CPC ............... H01L 23/40–4012; F16B 35/005
See application file for complete search history.

(56) References Cited

U.S. PATENT DOCUMENTS

| | | | | |
|---|---|---|---|---|
| 5,473,510 A | * | 12/1995 | Dozier, II | H01L 23/4006 174/548 |
| 5,757,621 A | * | 5/1998 | Patel | H01L 23/4006 257/719 |
| 5,901,039 A | * | 5/1999 | Dehaine | H01L 23/4006 361/704 |
| 6,480,387 B1 | * | 11/2002 | Lee | H01L 23/4006 165/80.3 |
| 6,549,410 B1 | * | 4/2003 | Cohen | H01L 23/4006 165/185 |
| 6,611,431 B1 | * | 8/2003 | Lee | H01L 23/4006 257/719 |
| 7,262,969 B2 | * | 8/2007 | Lee | H01L 23/4006 165/185 |
| 7,342,796 B2 | * | 3/2008 | Aukzemas | F16B 37/145 165/185 |
| 7,359,200 B2 | * | 4/2008 | Zhou | H01L 23/4006 165/80.3 |

(Continued)

FOREIGN PATENT DOCUMENTS

JP          09139450 A  *  5/1997

*Primary Examiner* — Robert J Hoffberg
(74) *Attorney, Agent, or Firm* — Patent Capital Group

(57) ABSTRACT

Particular embodiments described herein provide for an electronic device that can be configured to include a printed circuit board, where the printed circuit board has a first side and an opposite second side, a heat source located on the first side of the printed circuit board, a heatsink over the heat source, and one or more fasteners coupled to the heatsink. The one or more fasteners go through the printed circuit board and each of the one or more fasteners includes a printed circuit board securing area that extends along the second side of the printed circuit board to help secure the heatsink to the printed circuit board and create an applied load on the heat source. In an example, a thermal interface material layer less than about one hundred (100) micrometers in in thickness can be between the heat source and the heatsink.

20 Claims, 7 Drawing Sheets

(56) References Cited

U.S. PATENT DOCUMENTS

| | | | | |
|---|---|---|---|---|
| 7,388,746 B2* | 6/2008 | Park | ................... | H01L 23/4006 |
| | | | | 165/80.4 |
| 7,468,889 B2* | 12/2008 | Su | ...................... | H01L 23/4006 |
| | | | | 165/80.2 |
| 7,474,530 B2* | 1/2009 | Stewart | ............... | H01L 23/4006 |
| | | | | 165/104.33 |
| 7,518,862 B1* | 4/2009 | Macika | .................... | G06F 1/20 |
| | | | | 361/688 |
| 7,835,153 B2* | 11/2010 | Kearns | ................... | H01L 23/40 |
| | | | | 361/719 |
| 8,432,698 B2* | 4/2013 | Liu | ................... | H05K 7/20172 |
| | | | | 361/720 |
| 8,794,889 B2* | 8/2014 | Aukzemas | .............. | F16B 31/04 |
| | | | | 411/353 |
| 9,041,196 B2* | 5/2015 | Bayerer | ................. | H05K 1/141 |
| | | | | 257/718 |
| 9,204,572 B2* | 12/2015 | Takahashi | ................ | H05K 7/20 |
| 10,170,391 B2* | 1/2019 | Dickover | ............ | H01L 23/4338 |
| 10,440,812 B2* | 10/2019 | He | ........................... | F28F 3/02 |
| 10,764,990 B1* | 9/2020 | Chen | ................... | H05K 1/021 |
| 10,772,245 B2* | 9/2020 | Craig | ................. | H05K 7/20445 |
| 2008/0117598 A1* | 5/2008 | Hsu | .................... | H01L 23/4006 |
| | | | | 361/704 |
| 2013/0208427 A1* | 8/2013 | Lin | ......................... | H01L 23/40 |
| | | | | 361/720 |
| 2013/0314877 A1* | 11/2013 | Watanabe | ............... | H01L 23/34 |
| | | | | 361/719 |
| 2017/0290209 A1* | 10/2017 | Craig | ................... | H01L 23/552 |

* cited by examiner

HEATSINK SECURED TO A HEAT SOURCE

TECHNICAL FIELD

This disclosure relates in general to the field of computing and/or device cooling, and more particularly, to a heatsink secured to a heat source.

BACKGROUND

Emerging trends in systems place increasing performance demands on the system. The increasing demands can cause thermal increases in the system. The thermal increases can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

The FIGURES of the drawings are not necessarily drawn to scale, as their dimensions can be varied considerably without departing from the scope of the present disclosure.

DETAILED DESCRIPTION

EXAMPLE EMBODIMENTS

The following detailed description sets forth examples of apparatuses, methods, and systems relating to enabling a heatsink secured to a heat source. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

Figure 1:
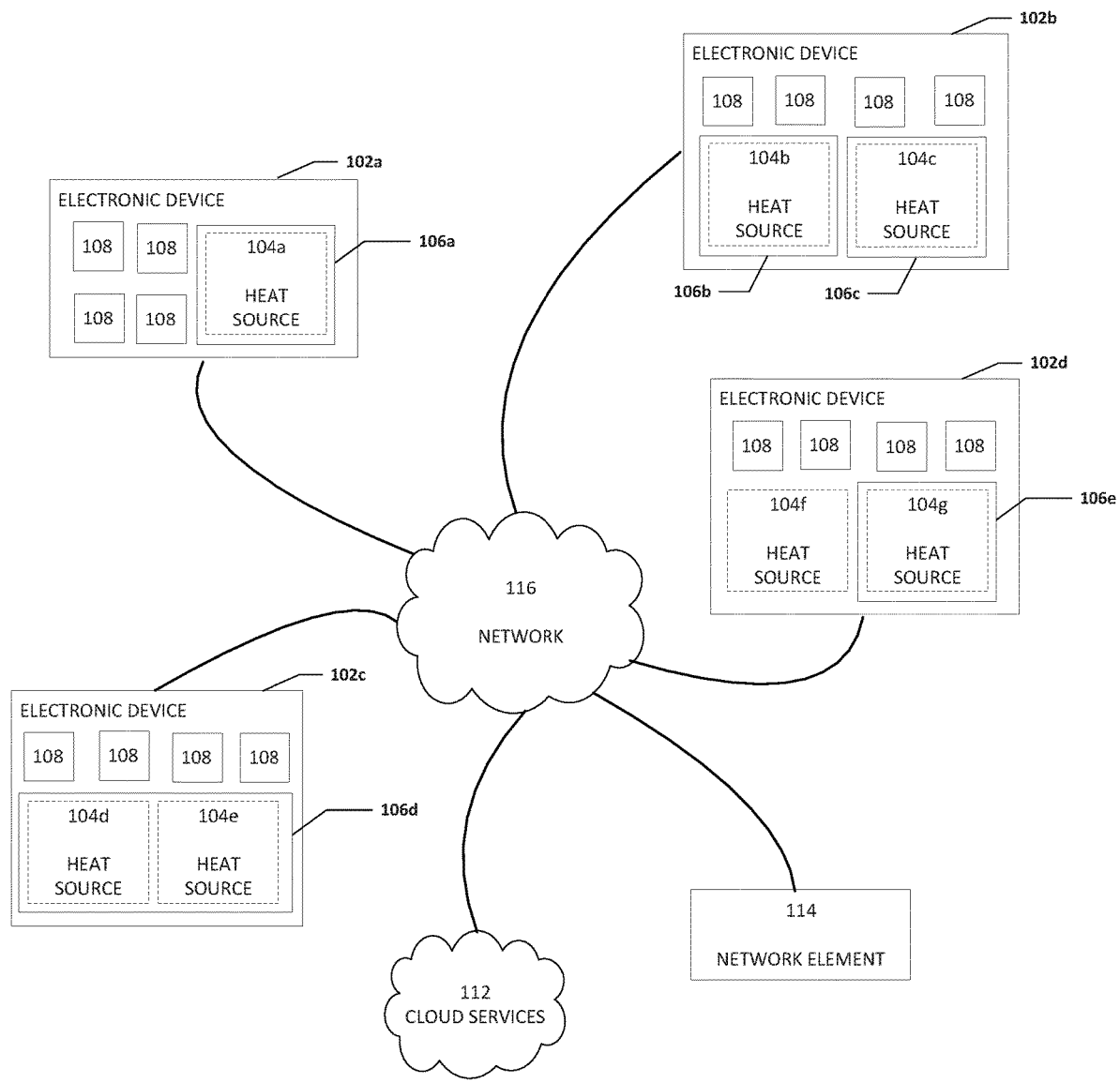
FIG. 1 is a simplified block diagram of a system to enable a heatsink secured to a heat source, in accordance with an embodiment of the present disclosure.

FIG. 1 is a simplified block diagram of an electronic device configured with a heatsink secured to a heat source, in accordance with an embodiment of the present disclosure. In an example, an electronic device can include one or more heat sources. Each of the one or more heat sources may have a corresponding heatsink. For example, as illustrated in FIG. 1, electronic device 102a includes heat source 104a, a corresponding heatsink 106a, and one or more electronics 108. In addition, electronic device 102b includes heat sources 104b and 104c, corresponding heatsinks 106b and 106c respectively, and one or more electronics 108. Also, electronic device 102c includes heat sources 104d and 104e, and one or more electronics 108. Heatsink 106d can correspond to both heat sources 104d and 104e. Further, electronic device 102d includes heat sources 104f and 104g and one or more electronics 108. Heat source 104f may not have a corresponding heatsink and heatsink 106e may correspond to heat source 104g. Each of electronic devices 102a-120d may be in communication with each other, cloud services 112, and/or network element 114 using network 116. In some examples, one or more of electronic device 102a-102d may be standalone devices and not connected to network 116 or another device.

Each of heat sources 104a-104g may be a heat generating device (e.g., processor, logic unit, field programmable gate array (FPGA), chip set, integrated circuit (IC), a graphics processor, graphics card, battery, memory, or some other type of heat generating device). Each of heatsinks 106a-106e can be configured as a thermal cooling device to help remove thermal energy from one or more corresponding heat sources (e.g., heatsink 106a corresponds to heat source 104a, heatsink 106d corresponds to both heat sources 104d and 104e, etc.). Each of heatsinks 106a-106e may be a passive cooling device or an active cooling device to help reduce the thermal energy or temperature of one or more corresponding heat sources. Each of electronics 108 can be a device or group of devices available to assist in the operation or function of the electronic device that includes electronics 108.

In an example, a heatsink (e.g., heatsink 106*a*) can be coupled to a heat source (e.g., heat source 104*a*) to remove or reduce a gap between the heat source and heatsink that is commonly present in current designs. In an example, the heatsink can be coupled to the heat source with an applied load and rigidly secured to the heat source and/or the structure that supports the heat source. The applied load can allow the system to address the issue of large manufacturing variances in the gap between a heat source and a heatsink and/or chassis that deviate from a nominal design value.

In an example, the heat source may be an IC on a printed circuit board (PCB). The heatsink can be rigidly secured to the PCB using a plurality of setscrews and threaded fasteners such that oscillations in displacement of the heatsink, heat source, and PCB are reduced and the coupling of the heatsink, heat source, and PCB can withstand shocks and vibrations. In a specific example, each setscrew can have a hex opening (or other feature for a tool) on the top of the setscrew and a threaded hole on the bottom of the setscrew.

The setscrews can be configured to allow the gap between the heatsink and the heat source to be adjusted in order to eliminate or reduce the stack-up of large manufacturing variances in the gap between the heat source and the heatsink. More specifically, when the heatsink is coupled to the heat source, each setscrew can touch the PCB while an enabling load is applied. The heatsink can include threaded portions to allow the installation of the setscrews. The fasteners can be installed from the bottom of the PCB through blind holes in the PCB. The fasteners can include a PCB securing area that is larger than the blind holes in the PCB and the PCB securing area can help the fastener apply a force to the PCB in the direction towards the heatsink. In addition, the fasteners can be coupled to (e.g., threaded into) the setscrews to pull the heatsink down towards the PCB. The fasteners can use the PCB securing area on the bottom of the PCB to apply a force to the PCB in the direction towards the heatsink and can use the setscrew in the heatsink to pull the heatsink down towards the PCB and secure the heatsink to the heat source with an applied load. In addition, the fasteners coupled to the setscrews allow the PCB, heat source, and heatsink to be rigidly fixed to each other to create a rigid body and to enable a load on the heatsink and heat source to help the PCB, heat source, and heatsink to withstand shocks and vibrations. For example, the rigid body of the PCB, heat source, and heatsink can withstand a pulse of about four hundred (400) grams with a pulse width of about 1.5 milliseconds.

It is to be understood that other embodiments may be utilized and structural changes may be made without departing from the scope of the present disclosure. Substantial flexibility is provided in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. Further, the appearances of the phrase "in one example" or "in an example" are not necessarily all referring to the same examples.

Elements of FIG. 1 may be coupled to one another through one or more interfaces employing any suitable connections (wired or wireless), which provide viable pathways for network (e.g., network 116, etc.) communications. Additionally, any one or more of these elements of FIG. 1 may be combined or removed from the architecture based on particular configuration needs. Network 116 may include a configuration capable of transmission control protocol/Internet protocol (TCP/IP) communications for the transmission or reception of packets in a network. Each of electronic devices 102*a*-102*d* may also operate in conjunction with a user datagram protocol/IP (UDP/IP) or any other suitable protocol where appropriate and based on particular needs.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. However, the increase in performance and/or function causes an increase in the thermal challenges of the devices and systems.

In some systems, the heatsink can be coupled to an IC using a spring mechanism to enable an applied load on the IC. This allows the thermal interface material (TIM) to be relatively thin yet have relatively high performance (e.g., is a good conductor of thermal energy from the heat source to the heatsink). In order to withstand shocks and vibrations, embedded systems (e.g., engine control units (ECUs), in-vehicle-infotainment (IVI), networking antenna arrays (i.e. 5G antenna arrays), etc.) typically use a clam shell housing design that has large gaps between the heat dissipating ICs and the heatsink and/or chassis. Unfortunately, the large gaps are relatively inefficient at conducting thermal energy away from the IC.

Embedded systems span applications as diverse as telecom radio units, cash machines, and missile guidance systems. Each embedded system application has its own unique requirements, but a common typical embedded system requirement includes satisfying an ingress protection (IP) rating to shield the system from the external environment. IP is a characteristic feature that separates an embedded system from a client/server application. The compute board (e.g., mother board, integrated circuit, processor, logic, etc.) of an embedded system is generally sealed from the external environment with the most level of IP rating that the system design will allow. In a typical client or server system, the external air is allowed to pass directly through discreet heatsinks retained by the compute board. A relatively high IP rating often prevents the use of discreet board mounted thermal solutions in embedded systems and the thermally limiting compute board must sink to the chassis walls of the enclosure in an embedded system. In embedded systems, the compute board is often sealed and all cooling occurs on the exposed external surfaces of the chassis. Sinking the compute board to the chassis creates unique design problems. A high degree of ruggedization is required to meet diverse embedded requirements such as severe shock and vibration, elevated local ambient temperatures (e.g., about fifty-five degrees centigrade to about eight-five degrees centigrade), adverse environmental conditions (e.g., salt spray, solar thermal loads), segment specific IC package requirements (e.g., automotive AEC-Q100), etc.

Current embedded systems typically use a clam shell design that requires a thick TIM such as gap pads or fillers. The TIM between the compute board and the heat dissipating surface is critical to thermal performance and the thickness of the TIM and its conductivity are key performance metrics. Ideally, the TIM should be thin with high conductivity, however, current embedded systems typically include relatively large fixed gaps and the use of gap pads or curable gap filler materials. Unfortunately, such materials tend to have relatively low thermal performance.

Using springs connected to the compute board and a heatsink is proven to not be reliable for embedded systems because of the oscillations in position that cause failure of the TIM interface and solder joint reliability. In addition, using a clam shell design forces thermal engineers to use poor performing TIM materials, and that forces compromises in system design (e.g., lower performance components that generate less heat). In addition, traditional spring heatsink enabling does not fix the heatsink position in the X, Y, or Z positions (only through spring force) and is not able to withstand the incurred oscillations during relatively severe shock and vibration encountered by embedded systems. What is needed is a heatsink that can be secured to a heat source such that the heatsink can remain secured to the heat source during relatively high shocks and/or vibrations.

A system to secure a heatsink to a heat source, as outlined in FIG. 1, can resolve these issues (and others). In an example, a heatsink can be secured to a heat source to help enable an applied load on the heat source and TIM layer between the heat source and the heatsink. The system allows for variance in the gap between a heat source and a heatsink and can be adjusted to remove or reduce the gap between the heat source and the heatsink and allow for an applied load on the heat source and TIM layer. The applied load helps to eliminate or reduce the manufacturing variances in the gap between a heat source and a heatsink and allows for a thin high performance TIM to be used between the heat source and heatsink. In an example, the TIM thickness can be about twenty (20) micrometers to about one hundred (100) micrometers. The applied load also helps allow the heatsink to be secured to the heat source such that the heatsink and heat source connection can withstand shocks and vibrations and the heat source and heatsink position can be rigidly fixed in the X, Y and Z directions.

More specifically, the system allows for an applied load to be applied to a heat dissipating IC in an embedded electronics assembly and fixes the PCB/ICs in the X, Y and Z directions. Once the applied load is placed on the IC during assembly, the heatsink/chassis is fixed in place in order to make the assembly a rigid body that will be able to withstand relatively high shocks and/or vibrations and can help to increase reliability by limiting the amplitude of oscillations and reduce PCB and system stress. This allows a thin TIM to be used (e.g., less than about one hundred (100) micrometers (um)) and enables an high volume manufacturing feasible solution for enabling an applied load directly on an IC by helping to eliminate issues related to manufacturing variances in the gap between the heat source and the heatsink and to also to make the heatsink, heat source, and PCB a rigid body by fixing the heatsink, heat source, and PCB in the X, Y and Z planes.

Turning to the infrastructure of FIG. 1, network 116 represents a series of points or nodes of interconnected communication paths for receiving and transmitting packets of information. Network 116 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 116, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, electronic devices 102a-102d are meant to encompass a computer, a personal digital assistant (PDA), a laptop or electronic notebook, a cellular telephone, an iPhone, an IP phone, network elements, network appliances, servers, routers, switches, gateways, bridges, load balancers, processors, modules, or any other device, component, element, or object that includes a heat source, especially a heat source in an embedded system. Each of electronic devices 102a-120d may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of electronic devices 102a-120d may include virtual elements.

In regards to the internal structure, each of electronic devices 102a-120d can include memory elements for storing information to be used in the operations outlined herein. Each of electronic devices 102a-120d may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for the operations described herein. This includes the memory elements being able to store software, logic, code, or processor instructions that are executed to carry out the activities described herein.

Additionally, each of heat sources 104a-104g may be or include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the heat elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2:
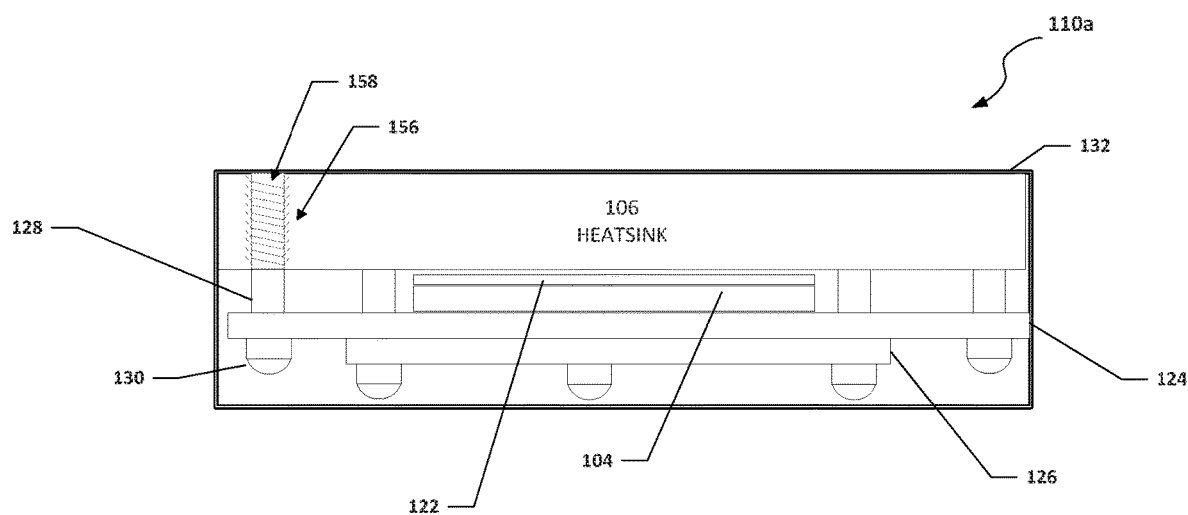
FIG. 2 is a simplified block diagram of a system to enable a heatsink secured to a heat source, in accordance with an embodiment of the present disclosure.

Turning to FIG. 2, FIG. 2 is a simplified block diagram of a heatsink/heat source system 110a. Heatsink/heat source system 110a can include a heatsink secured to a heat source. In an example, heatsink 106 can be over heat source 104 with a TIM 122 between heatsink 106 and heat source 104. Heat source 104 can be on PCB 124. In some examples, a backplate 126 may be used as a stiffener to help support heat source 104 and PCB 124. In some examples, backplate 126 is not present. Heat sink 106 can include heatsink threads 156. One or more setscrews can include outside setscrew threads 158. One or more setscrews 128 can be threaded through heatsink 106 using heatsink threads 156 and outside setscrew threads 158. A corresponding one or more fasteners 130 can be attached through backplate 126 and PCB 124 and into setscrews 128.

During assembly of heatsink/heat source system 110a, a load is applied to heatsink 106 and heat source 104. Heatsink 106 or a base of heatsink 106 can be threaded. Once the load is applied, setscrews 128 are tightened from the heatsink side until the setscrews 128 make contact with PCB 124. If backplate 126 is to be used, backplate 126 can be positioned behind heat source 104. Fasteners 130 are inserted through holes in PCB 124 and backplate 126 (if present) and then threaded into setscrews 128 and tightened. This allows setscrews 128, fasteners 130, and backplate 126 (if present) to rigidly hold heat source 104, heatsink 106, and PCB 124 in place and also maintain an applied load on heat source 104 and TIM 122.

Setscrews 128 can be installed from the top of heatsink 106 and setscrews 128 can make contact with PCB 124. This helps to eliminate or reduce the manufacturing variances in the gap between heat source 104 and heatsink 106, allows for a fixed gap distance between heat source 104 and heatsink 106, and/or allows for an enabling load on heat source 104 and use of a relatively thin TIM 122. For example, TIM 122 may have a thickness of less than about one hundred (100) micrometers. In another example, TIM 122 may have a thickness of about twenty (20) micrometers to about one hundred (100) micrometers In current clamshell housing, the manufacturing variance in the gap between a heat source and a heat sink is in the range of about 0.5 mm to about one (1) mm. In an example, because setscrews 128 go through heatsink 106 and onto PCB 124, setscrews 128 can help to create an applied load and help to eliminate or reduce the manufacturing variances in the gap between heat source 104 and heatsink 106. In another example, setscrews 128 can be adjusted to allow heatsink 106 to apply a desired direct load on heat source 104 or a predetermined gap between heat source 104 and heatsink 106. More specifically, setscrews 128 can be adjusted during assembly to fix the gap between heat source 104 and heatsink 106 to a desired or preferred distance (e.g., about twenty (20) um to about one hundred (100) um) or to a pre-determined pressure (e.g., about 20 psi) to help eliminate or reduce the effects of the manufacturing variances in the gap between the heat source and the heatsink.

In a specific illustrative example, setscrews 128 can have a hex hole for installation on the top of setscrew 128 and a threaded hole on the bottom of setscrew 128 where fasteners 130 can be inserted and tightened to help couple and secure heat source 104, heatsink 106, and PCB 124. If backplate 126 is to be used, backplate 126 can be added to the bottom of PCB 124 and fasteners 130 can be installed from the bottom through PCB 124 and backplate 126 to secure and provide support for heat source 104, heatsink 106, and PCB 124. This secures heatsink/heat source system 110a in the X, Y and Z direction to create a rigid body (unlike some current solutions which are held in place with spring force only). Creating the rigid body reduces oscillations in heatsink/heat source system 110a and reduces displacement of heatsink 106 relative to heat source 104 and PCB 124, allowing heatsink/heat source system 110a to withstand shock and vibration. For example, the rigid body can allow heatsink/heat source system 110a to withstand a pulse of about four hundred (400) grams with a pulse width of about 1.5 milliseconds. In a specific example, heatsink 106 can form part of an external chassis. An enclosure 132 (e.g., a sheet metal enclosure) can seal heatsink/heat source system 110a by attaching to heatsink 106 and creating an embedded system.

Figure 3:
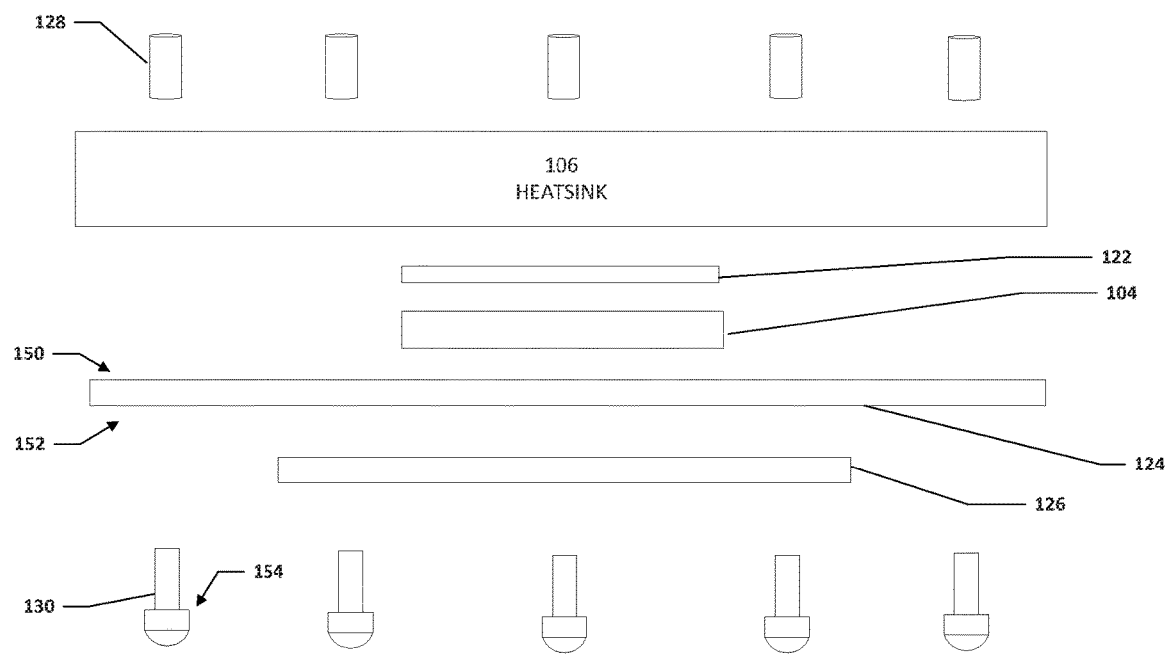
FIG. 3 is a simplified exploded view block diagram of a system to enable a heatsink secured to a heat source, in accordance with an embodiment of the present disclosure.

Turning to FIG. 3, FIG. 3 is a simplified exploded block diagram of heatsink/heat source system 110a. In an example, heatsink/heat source system 110a can include heat source 104, heatsink 106, TIM 122, PCB 124, backplate 126, a plurality of setscrews 128, and a plurality of fasteners 130. In another example, heatsink/heat source system 110a does not include backplate 126. PCB 124 can include a first side 150 and a second side 152. Each of plurality of fasteners 130 can include a PCB securing area 154. The number of plurality of setscrews 128 corresponds to the number of plurality of fasteners 130. The total number of plurality of setscrews 128 and corresponding plurality of fasteners 130 depends on the system application and design constraints. For example, if a heatsink/heat source system will undergo a relatively large amount of high shocks and/or vibrations, then the total number of plurality of setscrews 128 and corresponding plurality of fasteners 130 can be greater than the total number of plurality of setscrews 128 and corresponding plurality of fasteners 130 used in a heatsink/heat source system that will not undergo a relatively large amount of high shocks and/or vibrations. In addition, if a heatsink/heat source system has a relatively small profile or surface area, then the total number of plurality of setscrews 128 and corresponding plurality of fasteners 130 may be fewer than a heatsink/heat source system that has a relatively large profile or surface area.

Figure 4A:
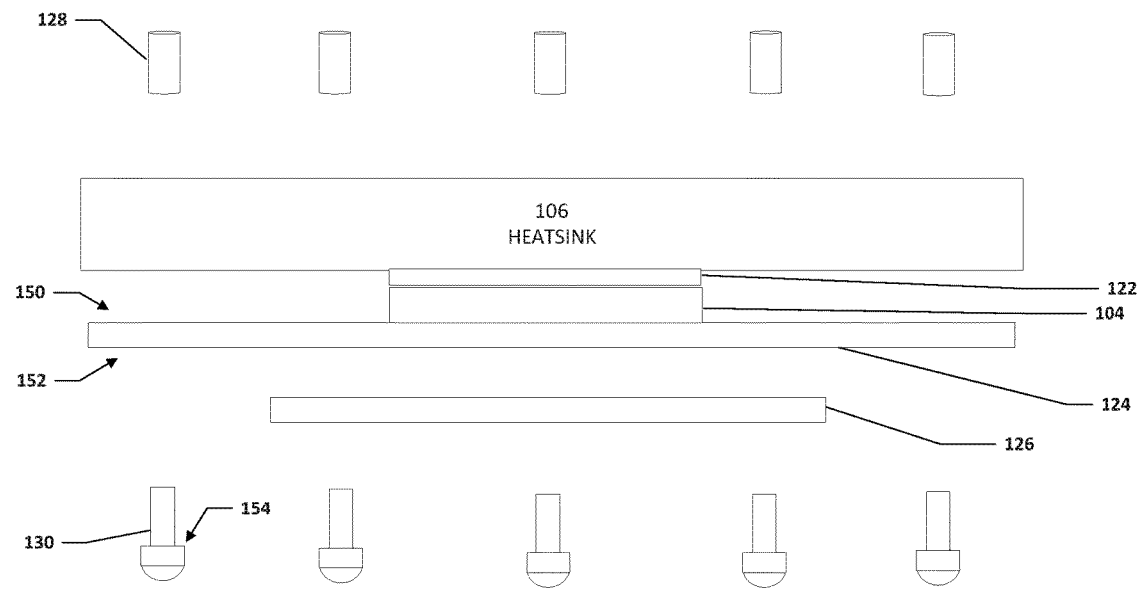
FIG. 4A is a simplified block diagram of a system to enable a heatsink secured to a heat source, in accordance with an embodiment of the present disclosure.

Turning to FIG. 4A, FIG. 4A is a simplified block diagram of an early stage in the formation of heatsink/heat source system 110*a* in accordance with an embodiment of the present disclosure. As illustrated in FIG. 4A, heat source 104 can be coupled to PCB 124. TIM 122 can be applied over heat source 104 and heatsink 106 can be positioned over heat source 104 and TIM 122.

Figure 4B:
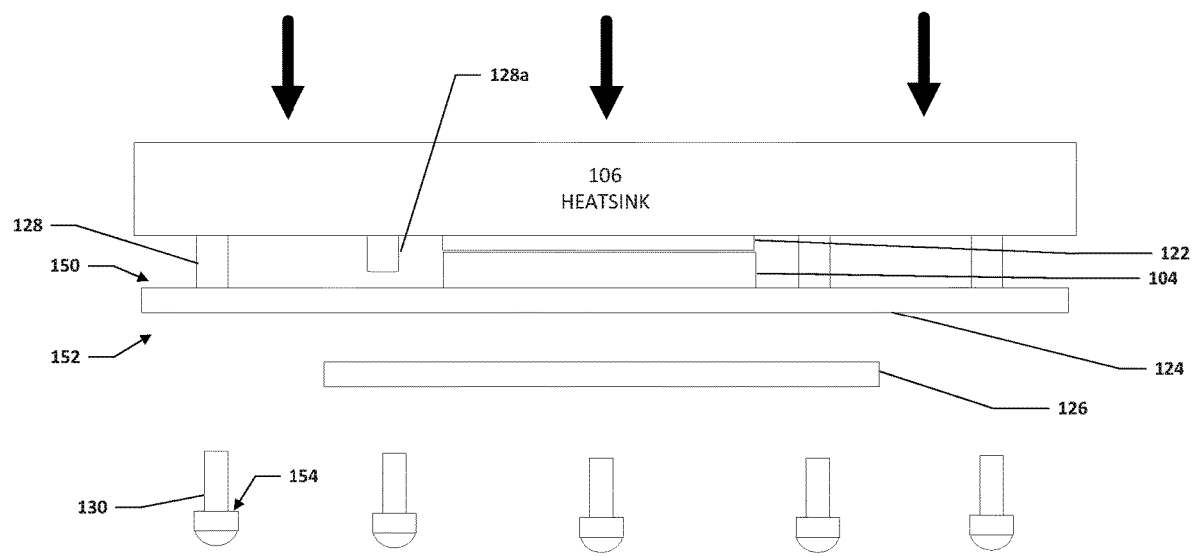
FIG. 4B is a simplified block diagram of a system to enable a heatsink secured to a heat source, in accordance with an embodiment of the present disclosure.

Turning to FIG. 4B, FIG. 4B is a simplified block diagram of an early stage in the formation of heatsink/heat source system 110*a* in accordance with an embodiment of the present disclosure. As illustrated in FIG. 4B, a load can be applied to heatsink 106 and heat source 104. Once the load is applied, setscrews 128 can be inserted such that setscrews 128 extend from heatsink 106 to PCB 124. In an example, due to design constraints or other reasons, one or more setscrews may not fully extend from heatsink 106 to PCB 124. For example, as Illustrated in FIG. 4B, setscrew 128*a* does not extend all the way to PCB 124. In some examples, setscrews 128 can be inserted into heatsink 106 before heatsink 106 is positioned over heat source 104. The application of the load can help to remove or reduce the gap between heat source 104 and heatsink 106.

Figure 4C:
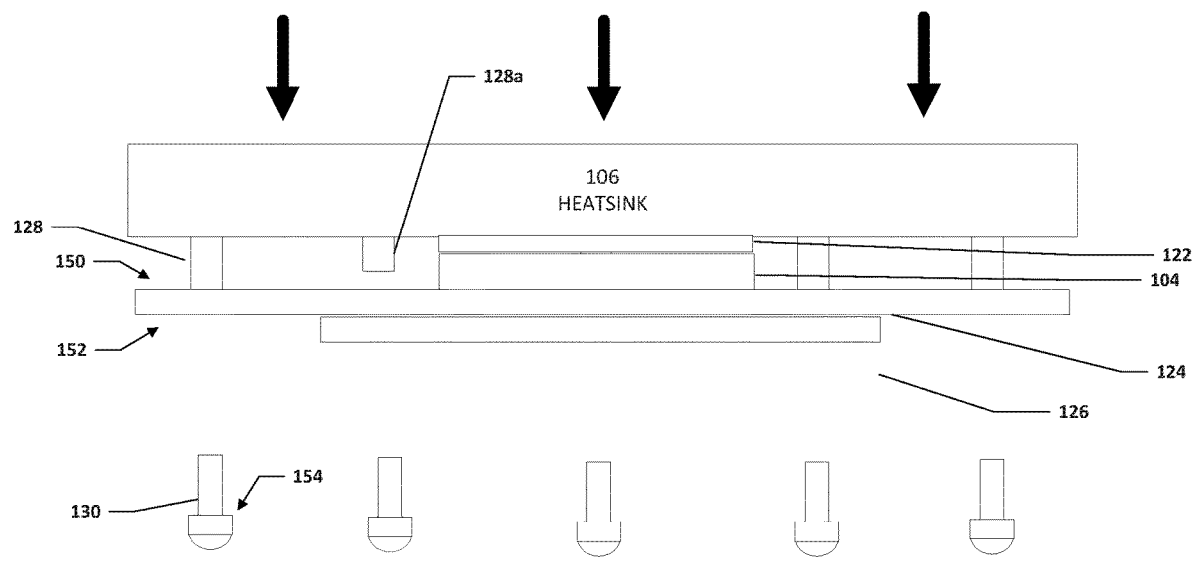
FIG. 4C is a simplified block diagram of a system to enable a heatsink secured to a heat source, in accordance with an embodiment of the present disclosure.

Turning to FIG. 4C, FIG. 4C is a simplified block diagram of a stage in the formation of heatsink/heat source system 110*a* in accordance with an embodiment of the present disclosure. If backplate 126 is to be used, backplate 126 can be applied behind heat source 104, as illustrated in FIG. 4C. Backplate 126 can add structural support to PCB 124.

Figure 4D:
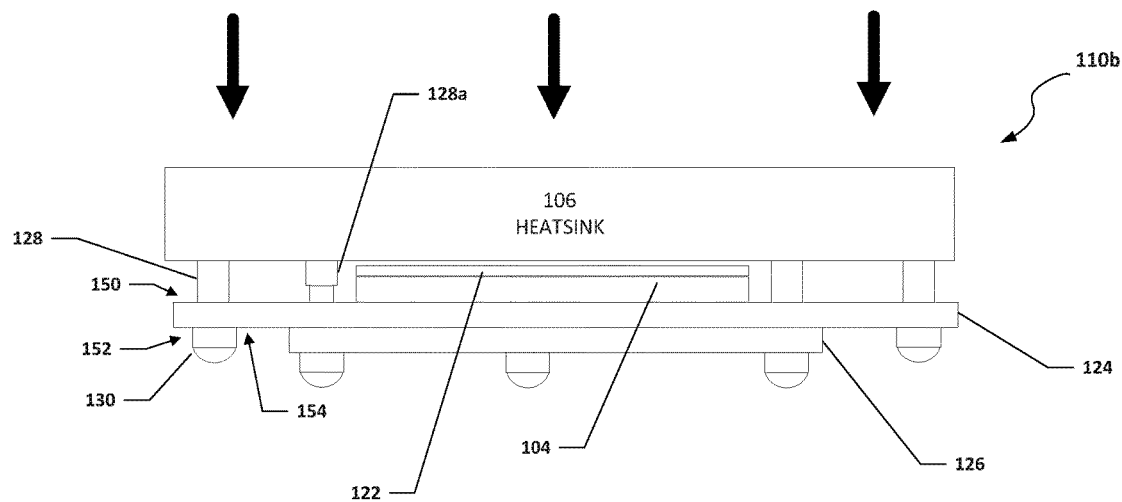
FIG. 4D is a simplified block diagram of a system to enable a heatsink secured to a heat source, in accordance with an embodiment of the present disclosure.

Turning to FIG. 4D, FIG. 4D is a simplified block diagram of a stage in the formation of heatsink/heat source system 110*a* in accordance with an embodiment of the present disclosure. As illustrated in FIG. 4D, with the load still being applied, fasteners 130 can be inserted through pre-created holes in backplate 126 and PCB 124. Fasteners 130 can use PCB securing area 154 on second side 152 of PCB 124 (the bottom of the PCB) to apply a force to PCB 124 in the direction towards heatsink 106. Fasteners 130 can then be threaded into setscrews 128 and tightened.

Fasteners 130 can use setscrew 128 in heatsink 106 to pull heatsink 106 down towards PCB 124 and secure heatsink 106 to heat source 104 with an applied load. This allows setscrews 128, fasteners 130, and backplate 126 (if present) to rigidly hold PCB 124 in place and also maintain an applied load on heat source 104 and TIM 122. More specifically, PCB securing area 154 on fastener 130 and setscrew 128 can help to secure heatsink 106 to heat source 104 with an applied load. This secures heatsink/heat source system 110*a* in the X, Y and Z direction to create a rigid body, unlike some current solutions that hold the heatsink in place with only a spring force that creates friction in the in-plane direction and applies some nominal pressure in the through plane direction but cannot withstand shocks and/or vibrations. By rigidly coupling or connecting heatsink 106 to PCB 124, a rigid body can be created that reduces oscillations in displacement between heat source 104, heatsink 106, and PCB 124 and can allow heatsink/heat source system 110*a* to withstand shock and vibration. In an example, an enclosure (e.g., enclosure 132 illustrated in FIG. 2) can be added around heatsink 106 and PCB 124 to create an embedded system.

Figure 5:
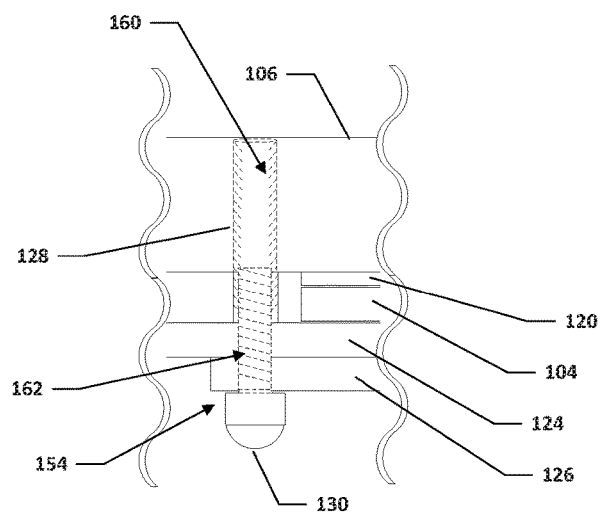
FIG. 5 is a simplified block diagram of a portion of a system to enable a heatsink secured to a heat source, in accordance with an embodiment of the present disclosure.

Turning to FIG. 5, FIG. 5 is a simplified block diagram of a portion of heatsink/heat source system 110*a*. As illustrated in FIG. 5, setscrew 128 can extend into heatsink 106. In some examples, setscrew 128 can partially extend into heatsink 106 or in other examples, setscrew 128 can extend through heatsink 106 from one side of heatsink 106 to the opposite side of heatsink 106. Setscrew 128 can extend from heatsink 106 to the top surface of PCB 124 to fix the gap between heat source 104 and heatsink 106 to a desired or preferred distance (e.g., about twenty (20) um to about one hundred (100) um). Setscrew 128 can include inside setscrew threads 160. Fastener 130 can include fastener threads 162. Fastener 130 can be threaded or otherwise securely inserted into setscrew 128 using inside setscrew threads 160 and fastener threads 162. In some examples, fastener 130 can extend further into setscrew 128 than is shown in FIG. 5 and into heatsink 106.

Figure 6:
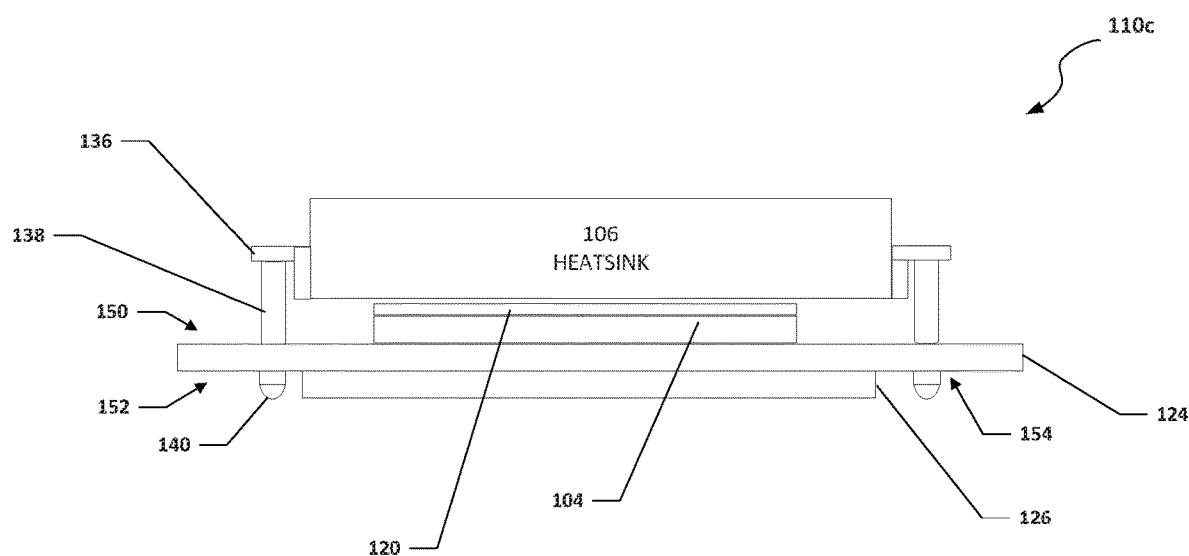
FIG. 6 is a simplified block diagram of a system to enable a heatsink secured to a heat source, in accordance with an embodiment of the present disclosure.

Turning to FIG. 6, FIG. 6 is a simplified block diagram of an embodiment of a heatsink/heat source system 110*b*. Heatsink/heat source system 110*b* can include heat source 104, heatsink 106, TIM 122, PCB 124, and backplate 126. PCB 124 can include first side 150 and second side 152. Heatsink 106 can be secured to PCB 124 using secure bracket 136, securing sleeve 138, and securing screw 140. Secure bracket 136 can be rigidly secured to heatsink 106. Securing sleeve 138 can extend from secure bracket 136 to PCB 124. Securing screw 140 can extend through PCB 124 and into securing sleeve 138. Securing screw 140 can include PCB securing area 154. PCB securing area 154 on securing screw 140 and secure bracket 136 can help to secure heatsink 106 to heat source 104 with an applied load.

Figure 7:
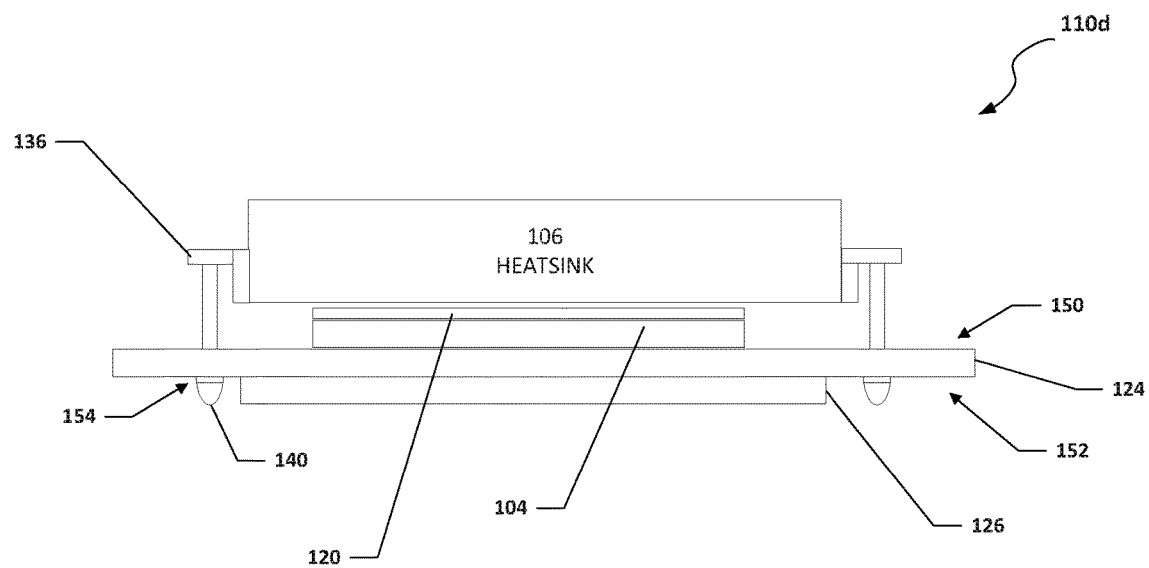
FIG. 7 is a simplified block diagram of a system to enable a heatsink secured to a heat source, in accordance with an embodiment of the present disclosure.

Turning to FIG. 7, FIG. 7 is a simplified block diagram of an embodiment of a heatsink/heat source system 110*c*. Heatsink/heat source system 110*c* can include heat source 104, heatsink 106, TIM 122, PCB 124, and backplate 126. PCB 124 can include first side 150 and second side 152. Heatsink 106 can be secured to PCB 124 using secure bracket 136 and securing screw 140. Secure bracket 136 can be rigidly secured to heatsink 106. Securing screw 140 can extend through PCB 124 and into secure bracket 136. Securing screw 140 can include PCB securing area 154. PCB securing area 154 on securing screw 140 and secure bracket 136 can help to secure heatsink 106 to heat source 104 with an applied load.

Figure 8:
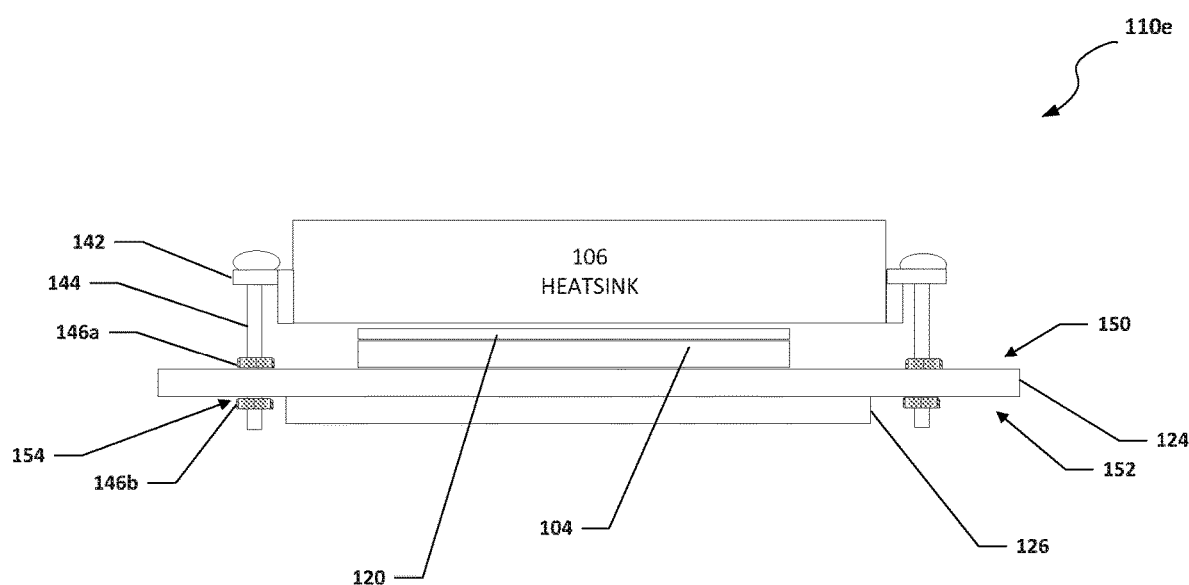
FIG. 8 is a simplified block diagram of a system to enable a heatsink secured to a heat source, in accordance with an embodiment of the present disclosure.

Turning to FIG. 8, FIG. 8 is a simplified block diagram of an embodiment of a heatsink/heat source system 110*d*. Heatsink/heat source system 110*d* can include heat source 104, heatsink 106, TIM 122, PCB 124, and backplate 126. Heatsink 106 can be secured to PCB 124 using bracket 142 and threaded bolt 144. Bracket 142 can be rigidly secured to heatsink 106. Threaded bolt 144 can extend from bracket 142 and through PCB 124. Securing nuts 146*a* and 146*b* can help to secure threaded bolt 144 to PCB 124. More specifically, securing nut 146*a* may be on first side 150 of PCB 124 and securing nut 146*b* may be on second side 152 of PCB 124. Securing nut 146*b* can include PCB securing area 154. PCB securing area 154 on securing nut 146*b* and bracket 142 can help to secure heatsink 106 to heat source 104 with an applied load.

Figure 9:
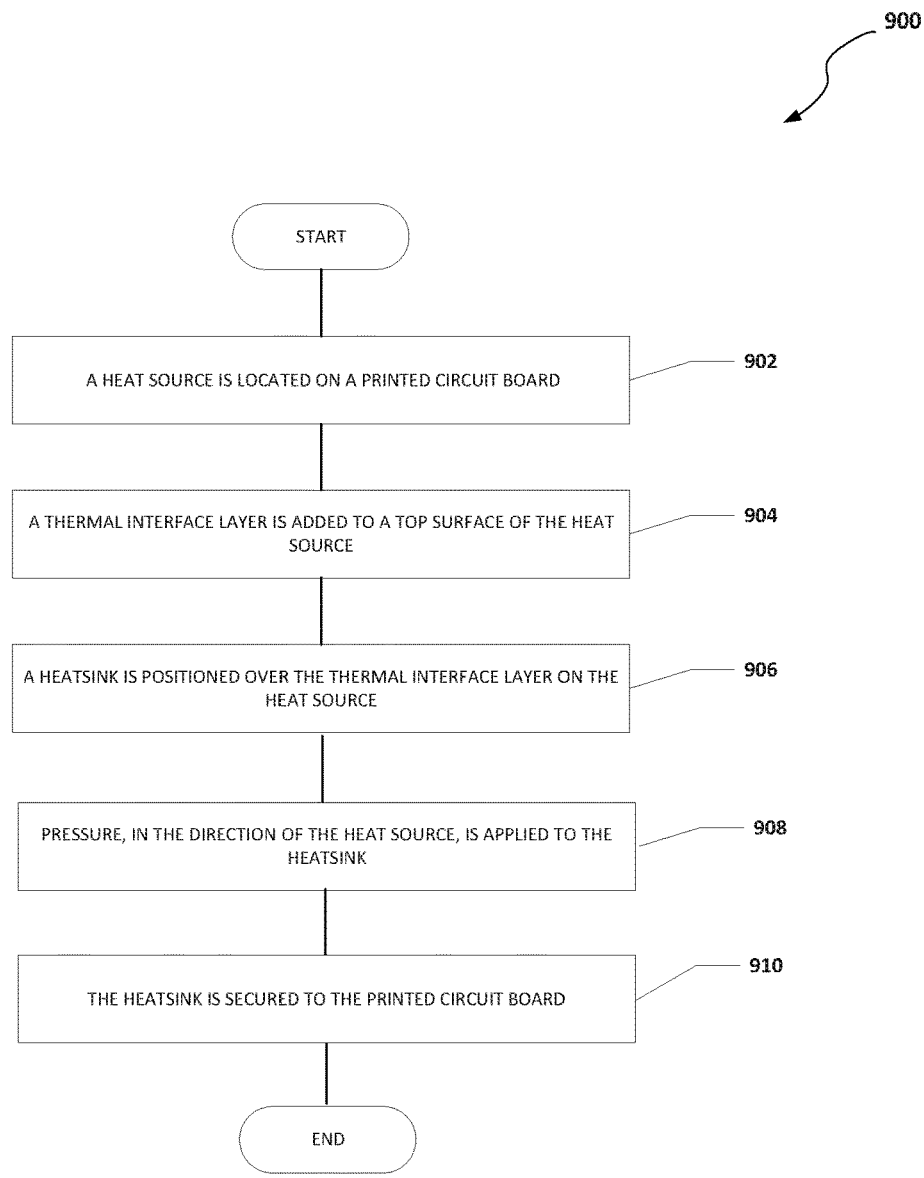
FIG. 9 is a simplified flowchart illustrating potential operations that may be associated with the system in accordance with an embodiment.

Turning to FIG. 9, FIG. 9 is an example flowchart illustrating possible operations of a flow 900 that may be associated with enabling a disposition of a workload based on a thermal response of a device, in accordance with an embodiment. At 902, a heat source is located on a PCB. At

904, a TIM is added to a top surface of the heat source. At 906, a heatsink is positioned over the TIM layer on the heat source. At 908, pressure, in the direction of the heat source, is applied to the heatsink. At 910, the heatsink is secured to the PCB. For example, the heatsink can be secured to the PCB as illustrated in FIG. 2, FIG. 6, FIG. 7, FIG. 8, or by some other means. In an example, an enclosure (e.g., enclosure 132) can seal the system and create an embedded system.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although electronic device 100 has been illustrated with reference to particular elements and operations, these elements and operations may be replaced by any suitable architecture, protocols, and/or processes that achieve the intended functionality of electronic devices 102*a*-102*d*.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, an electronic device can include a printed circuit board, where the printed circuit board has a first side and an opposite second side, a heat source located on the first side of the printed circuit board, a heatsink over the heat source, and one or more fasteners coupled to the heatsink, where the one or more fasteners go through the printed circuit board and each of the one or more fasteners includes a printed circuit board securing area that extends along the second side of the printed circuit board to help secure the heatsink to the printed circuit board and create an applied load on the heat source.

In Example A2, the subject matter of Example A1 can optionally include one or more setscrews coupled to the heatsink, where each of the one or more fasteners are coupled to the heatsink using a corresponding setscrew.

In Example A3, the subject matter of any one of Examples A1-A2 can optionally include where each of the one or more setscrews extend from the heatsink to the printed circuit board.

In Example A4, the subject matter of any one of Examples A1-A3 can optionally include a thermal interface material layer between the heat source and the heatsink, where the thermal interface material layer is less than about one hundred (100) micrometers in thickness.

In Example A5, the subject matter of any one of Examples A1-A4 can optionally include where the printed circuit board, heat source, and heatsink are located in an embedded system.

In Example A6, the subject matter of any one of Examples A1-A5 can optionally include where the embedded system can withstand a pulse of about four hundred (400) grams with a pulse width of about 1.5 milliseconds.

In Example A7, the subject matter of any one of Examples A1-A6 can optionally include a backplate located on the second side of the printed circuit board, where a portion of the one or more fasteners go through the backplate.

Example M1 is a method including coupling a heat source to a first side of a printed circuit board, where the printed circuit board includes the first side and an opposite second side, coupling a heatsink to the heat source, applying a load to the heatsink, and securing the heatsink to the printed circuit board with one or more fasteners, where the one or more fasteners go through the printed circuit board to the heatsink and each of the one or more fasteners includes a printed circuit board securing area that extends along the second side of the printed circuit board to help secure the heatsink to the printed circuit board and create an applied load on the heat source.

In Example M2, the subject matter of Example M1 can optionally include securing one or more setscrews to the heatsink, where each of the one or more fasteners extend from the printed circuit board and couple with a corresponding setscrew secured to the heatsink.

In Example M3, the subject matter of any one of the Examples M1-M2 can optionally include where each of the one or more setscrews extend from the heatsink to the printed circuit board.

In Example M4, the subject matter of any one of the Examples M1-M3 can optionally include applying a thermal interface material layer between the heat source and the heatsink, where the thermal interface material layer is less than about one hundred (100) micrometers in thickness.

In Example M5, the subject matter of any one of the Examples M1-M4 can optionally include enclosing the heat source, heatsink, and printed circuit board inside an enclosure to create an embedded system.

In Example, M6, the subject matter of any one of the Examples M1-M5 can optionally include where the one or more fasteners are two fasteners attached to either side of the heatsink.

In Example, M7, the subject matter of any one of the Examples M1-M6 can optionally include where a backplate is located on the second side of the printed circuit board and a portion of the one or more fasteners go through the backplate.

Example S1 is an embedded system. The embedded system can include a printed circuit board, where the printed circuit board has a first side and an opposite second side, a heat source located on the first side of the printed circuit board, a heatsink over the heat source, one or more fasteners coupled to the heatsink, where the one or more fasteners go through the printed circuit board and each of the one or more fasteners includes a printed circuit board securing area that extends along the second side of the printed circuit board to help secure the heatsink to the printed circuit board and create an applied load on the heat source, and an enclosure around the printed circuit board, heat source, and heatsink.

In Example S2, the subject matter of Example S1 can optionally include one or more setscrews coupled to the heatsink where each of the one or more fasteners are coupled to the heatsink using a corresponding setscrew.

In Example S3, the subject matter of any one of the Examples S1-S2 can optionally include where each of the one or more setscrews extend from the heatsink to the printed circuit board.

In Example S4, the subject matter of any one of the Examples S1-S3 can optionally include a thermal interface material layer between the heat source and the heatsink, where the thermal interface material layer is less than about one hundred (100) micrometers in thickness.

In Example S5, the subject matter of any one of the Examples S1-S4 can optionally include where the embedded system can withstand a pulse of about four hundred (400) grams with a pulse width of about 1.5 milliseconds.

In Example S6, the subject matter of any one of the Examples S1-S5 can optionally include where a backplate is located on the second side of the printed circuit board and a portion of the one or more fasteners go through the backplate.

Example AA1 is an apparatus including means for coupling a heat source to a first side of a printed circuit board, where the printed circuit board includes the first side and an opposite second side, means for coupling a heatsink to the heat source, means for applying a load to the heatsink, and means for securing the heatsink to the printed circuit board with one or more fasteners, where the one or more fasteners go through the printed circuit board to the heatsink and each of the one or more fasteners includes a printed circuit board securing area that extends along the second side of the printed circuit board to help secure the heatsink to the printed circuit board and create an applied load on the heat source.

In Example AA2, the subject matter of Example AA1 can optionally include means for securing one or more setscrews to the heatsink, where each of the one or more fasteners extend from the printed circuit board and couple with a corresponding setscrew secured to the heatsink.

In Example AA3, the subject matter of any one of Examples AA1-AA2 can optionally include where each of the one or more setscrews extend from the heatsink to the printed circuit board.

In Example AA4, the subject matter of any one of Examples AA1-AA3 can optionally include means for applying a thermal interface material layer between the heat source and the heatsink, where the thermal interface material layer is less than about one hundred (100) micrometers in thickness.

In Example AA5, the subject matter of any one of Examples AA1-AA4 can optionally include means for enclosing the heat source, heatsink, and printed circuit board inside an enclosure to create an embedded system.

In Example AA6, the subject matter of any one of Examples AA1-AA5 can optionally include where the one or more fasteners are two fasteners attached to either side of the heatsink.

In Example AA7, the subject matter of any one of Examples AA1-AA6 can optionally include where a backplate is located on the second side of the printed circuit board and a portion of the one or more fasteners go through the backplate.

Example X1 is a machine-readable storage medium including machine-readable instructions to implement a method or realize an apparatus as in any one of the Examples A1-A7, AA1-AA7, or M1-M7. Example Y1 is an apparatus comprising means for performing any of the Example methods M1-M7. In Example Y2, the subject matter of Example Y1 can optionally include the means for performing the method comprising a processor and a memory. In Example Y3, the subject matter of Example Y2 can optionally include the memory comprising machine-readable instructions.

What is claimed is:

1. An electronic device comprising:
   a printed circuit board, wherein the printed circuit board has a first side and an opposite second side;
   a heat source located on the first side of the printed circuit board;
   a heatsink over the heat source, wherein the heatsink includes a plurality of heatsink threads that extend through the heatsink;
   a plurality of setscrews accessible from a side of the heatsink opposite to the printed circuit board, wherein each of the setscrews thread through one of the heatsink threads of the heatsink to the printed circuit board and abut the first side of the printed circuit board; and
   a plurality of fasteners, wherein each of the plurality of fasteners is threaded into one of the plurality of setscrews from the second side of the printed circuit board, wherein each of the plurality of fasteners go through the printed circuit board, wherein each of the plurality of fasteners includes a printed circuit board securing area, and the printed circuit board securing area of at least a portion of the plurality of fasteners extends along and is proximate to the second side of the printed circuit board to help secure the heatsink to the printed circuit board and create an applied load on the heat source.

2. The electronic device of claim 1, wherein the plurality of setscrews are threaded into the heatsink using setscrew threads of the setscrews.

3. The electronic device of claim 1, wherein each of the plurality of setscrews has an internal thread threaded with one of the fasteners and an external thread threaded with one of the heatsink threads of the heatsink.

4. The electronic device of claim 1, wherein each of the setscrews has a hex-head accessible from the side of the heatsink opposite to the printed circuit board for installation of each of the setscrews.

5. The electronic device of claim 1, further comprising: a thermal interface material layer between the heat source and the heatsink, wherein the thermal interface material layer is less than one hundred (100) micrometers in thickness.

6. The electronic device of claim 1, further comprising:
   a backplate located on the second side of the printed circuit hoard, wherein another portion of the plurality of fasteners goes through the backplate and the printed circuit board securing area of the another portion of the plurality of fasteners extends along and is proximate to the backplate.

7. The electronic device of claim 1, wherein the printed circuit board, heat source, and heatsink are located in an embedded system.

8. The electronic device of claim 7, wherein the embedded system can withstand a pulse of substantially four hundred (400) grams with a pulse width of substantially 1.5 milliseconds.

9. A method comprising:
   coupling a heat source to a first side of a printed circuit board, wherein the printed circuit board includes the first side and an opposite second side;
   coupling a heatsink to the heat source, the heatsink includes a plurality of heatsink threads extending through the heatsink;
   threading each of a plurality of setscrews through one of the heatsink threads of the heatsink to the printed circuit board from a side of the heatsink opposite to the printed circuit board, wherein the setscrews abut the first side of the printed circuit board;

applying a load to the heatsink; and securing the heatsink to the printed circuit board by threading each of a plurality of fasteners into one of the setscrews from the second side of the printed circuit board, wherein each of the fasteners go through the printed circuit board, wherein each of the plurality of fasteners includes a printed circuit board securing area, and the printed circuit board securing area of at least a portion of the plurality of fasteners extends along and is proximate to the second side of the printed circuit board to help secure the heatsink to the printed circuit board and create an applied load on the heat source.

10. The method of claim 9, wherein each of the setscrews are threaded into the heatsink using setscrew threads of the setscrews.

11. The method of claim 9, wherein each of the plurality of setscrews has an internal thread threaded with one of the fasteners and an external thread threaded with one of the heatsink threads of the heatsink.

12. The method of claim 9, further comprising:
applying a thermal interface material layer between the heat source and the heatsink, wherein the thermal interface material layer is less than about one hundred (100) micrometers in thickness.

13. The method of claim 9, further comprising:
securing a backplate on the second side of the printed circuit board, wherein another portion of the plurality of fasteners goes through the backplate and the printed circuit board securing area of the another portion of the plurality of fasteners extends along and is proximate to the backplate.

14. The method of claim 9, wherein the plurality of fasteners are two fasteners attached to either side of the heatsink.

15. The method of claim 9, further comprising:
enclosing the heat source, heatsink, and printed circuit board inside an enclosure to create an embedded system.

16. An embedded system comprising:
a printed circuit board, wherein the printed circuit board has a first side and an opposite second side;
a heat source located on the first side of the printed circuit board;
a heatsink over the heat source, wherein the heatsink includes a plurality of heatsink threads that extend through the heatsink;
a plurality of setscrews accessible from a side of the heatsink opposite to the printed circuit board, wherein each of the setscrews thread through one of the heatsink threads of the heatsink to the printed circuit board and abut the first side of the printed circuit board;
a plurality of fasteners, wherein each of the plurality of fasteners is threaded into one of the plurality of setscrews from the second side of the printed circuit board, wherein each of the plurality of fasteners go through the printed circuit board, wherein each of the plurality of fasteners includes a printed circuit board securing area, and the printed circuit board securing area of at least a portion of the plurality of fasteners extends along and is proximate to the second side of the printed circuit board to help secure the heatsink to the printed circuit board and create an applied load on the heat source; and
an enclosure around the printed circuit board, the heat source, and the heatsink.

17. The embedded system of claim 16, wherein the plurality of setscrews threaded into the heatsink using setscrew threads of the setscrews.

18. The embedded system of claim 16, further comprising:
a thermal interface material layer between the heat source and the heatsink, wherein the thermal interface material layer is less than one hundred (100) micrometers in thickness.

19. The embedded system of claim 16, wherein the embedded system can withstand a puke of substantially four hundred (400) grams with a puke width of substantially 1.5 milliseconds.

20. The embedded system of claim 16, wherein a backplate is located on the second side of the printed circuit board, wherein another portion of the plurality of fasteners goes through the backplate and the printed circuit board securing area of the another portion of the plurality of fasteners extends along and is proximate to the backplate.

* * * * *

UNITED STATES PATENT AND TRADEMARK OFFICE
CERTIFICATE OF CORRECTION

PATENT NO. : 10,937,717 B2  
APPLICATION NO. : 16/370139  
DATED : March 2, 2021  
INVENTOR(S) : Michael Aaron Schroeder et al.

Page 1 of 1

It is certified that error appears in the above-identified patent and that said Letters Patent is hereby corrected as shown below:

On the Title Page

Item (57) Abstract, Line 14, delete "in in" and insert -- in. --, therefor.

In the Claims

In Column 14, Line 46, in Claim 6, delete "hoard;" and insert -- board; --, therefor.

In Column 16, Line 26 (approx.), in Claim 17, before "threaded" insert -- are; --, therefor.

In Column 16, Line 35 (approx.), in Claim 19, delete "puke;" and insert -- pulse; --, therefor.

In Column 16, Line 36 (approx.), in Claim 19, delete "puke;" and insert -- pulse; --, therefor.

Signed and Sealed this  
Fourth Day of May, 2021

Drew Hirshfeld  
*Performing the Functions and Duties of the*  
*Under Secretary of Commerce for Intellectual Property and*  
*Director of the United States Patent and Trademark Office*